United States Patent [19]

Fowler

[11] Patent Number: 4,550,330
[45] Date of Patent: Oct. 29, 1985

[54] SEMICONDUCTOR INTERFEROMETER

[75] Inventor: Alan B. Fowler, Yorktown Heights, N.Y.

[73] Assignee: International Business Machines Corporation, Armonk, N.Y.

[21] Appl. No.: 626,499

[22] Filed: Jun. 29, 1984

[51] Int. Cl.[4] .......................................... H01L 29/161
[52] U.S. Cl. ...................................... 357/16; 357/20; 357/15; 357/22
[58] Field of Search ........................ 357/16, 15, 20, 22

[56] References Cited

U.S. PATENT DOCUMENTS

| 4,194,935 | 3/1980 | Dingle et al. | 357/16 X |
| 4,205,329 | 5/1980 | Dingle et al. | 357/16 |
| 4,424,525 | 1/1984 | Mimura | 357/15 X |
| 4,450,462 | 5/1984 | Nuyen | 357/16 X |

OTHER PUBLICATIONS

Physical Review Letters, vol. 52, No. 2, Jan. 9, 1984, "Quantum Oscillations and the Aharonov-Bohm Effect for Parallel Resistors" by Gefen et al., p. 129.
Physics Letters, vol. 96A, No. 7, Jul. 18, 1983, p. 365, "Josephson Behavior in Small Normal One-Dimensional Rings" by Buttiker et al.
JETP Lett., vol. 34, No. 5, Sep. 5, 1981, p. 272, "Magnetic-Flux Quantization in a Cylindrical Film of a Normal Metal" by Sharvin et al.
JETP Lett., vol. 35, No. 11, Jun. 5, 1982, p. 588, "Observation of the Aaronov-Bohm Effect in Hollow Metal Cylinders" by Al'tshuler et al.
IBM Journal of Research and Development, vol. 1, No. 3, Jul. 1957, p. 223, "Spatial Variation of Currents and Fields Due to Localized etc." by Landauer.
IEEE Spectrum, Feb. 1984, "The HEMT: A Superfast Transistor" by Morkoc and Solomon, p. 28.
Rev. Mod. Phys., vol. 54, No. 2, Apr. 1982, particularly pp. 618-621, "Electronic Properties of Two-Dimensional Systems" by Tsuneya Ando et al.

Primary Examiner—Martin H. Edlow
Attorney, Agent, or Firm—Alvin J. Riddles

[57] ABSTRACT

An interferometer is constructed by providing a bifurcated branch conductive path coplanar with a heterojunction in a semiconductor with a band discontinuity that produces a potential well so that electron wave conduction at the heterojunction can be locally influence with an electric field applied to one branch of the bifurcated path.

9 Claims, 3 Drawing Figures

SEMICONDUCTOR INTERFEROMETER

DESCRIPTION

1. Field of the Invention

The technical field of the invention is in electrical signal devices that require very little physical space and dissipate very little energy.

2. Background Art

One switching structure currently receiving attention in the art that occupies small space and exhibits low energy dissipation employs an alternating current signal passing around separate opposing semicircular paths that is influenced by a magnetic field in one of the paths. The magnetic field operates to change the phase relationship of the currents in the two paths sufficiently to produce reinforcing or destructive interference. Such a structure together with the physics involved is described in Quantum Oscillations and the Aharonov-Bohm Effect for Parallel Resistors, Phys. Rev. Ltrs. 52, No. 2, January 1984, page 129.

The use of a magnetic field for control purposes, however, has limitations due to impedance and response time considerations.

DISCLOSURE OF THE INVENTION

The invention is the use of the responsiveness to an electric field of electrons in a quantum well adjacent to a semiconductor heterojunction interface to provide reinforcing or destructive interference to a signal involving opposed branches of a conductor path adjacent to the heterojunction interface.

For purposes of clarity of explanation, the invention will be described in terms of the heterojunction being at the interface of GaAs and $Ga_{1-x}Al_xAs$ and the carriers being electrons, although in the light of the principles set forth other materials, structural variations and carrier types will be apparent to one skilled in the art.

In a semiconductor having a heterojunction, electrons in a quantum well at the heterojunction interface will have a wave nature with essentially no loss of phase over relatively large distances. This can occur because the mean free path of the electrons with respect to the scattering phenomena can be longer than the critical dimensions of the structure involved. The mean free path is of the order of 10 micrometers in some GaAs-$Ga_{1-x}Al_xAs$ heterostructures. The structure employing the principles of the invention must be of a size less than the mean free path for scattering of the electrons.

In accordance with the invention, where the heterojunction is provided in semiconductor material with a long electron mean free path in a region of the semiconductor adjacent to the surface and a conductor path having a pattern of opposed or bifurcated branches of the order of the mean free path length is positioned on the surface, an electric field applied to change the electron wave length over a portion of one path will in turn produce constructive or destructive interference in a signal in the conductor path.

The device of the invention involves electrons moving in waves in a potential well adjacent a heterojunction.

Devices involving the concept of high mobility electrons adjacent a heterojunction are known as HEMT devices and are described in IEEE Spectrum, February 1984, p. 28. In these devices the doping is arranged to enhance mobility and to contribute electrons to the conducting layer in the GaAs near the $Ga_{1-x}Al_xAs$ interface.

Figure 1:
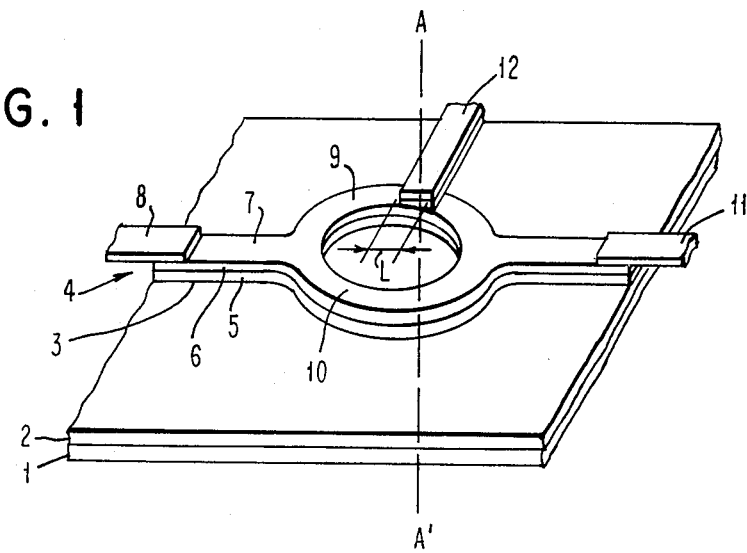
FIG. 1 is a schematic illustration of the electron interferometer of the invention.

In FIG. 1 there is provided a schematic diagram of the elements of the invention in their general functional relationship.

Referring to FIG. 1, a buffer layer 1 of doped GaAs with a substrate not shown. Epitaxial therewith a layer 2 of undoped GaAs is provided. The layer 2 is epitaxial with and forms a heterojunction 3 with a region of a different semiconductor 4 of $Ga_{1-x}Al_xAs$ which in turn has an undoped layer 5 and a highly doped layer 6. Layers 5 and 6 are present only in the shape of the conductor path labelled 7. The heterojunction material properties are such that a potential well exists in the material on the side of the heterojunction interface away from the surface. The potential well contains a carrier concentration sometimes referred to in the art as an electron gas. The conducting path 7 has an input contact 8, opposed semicircular branches 9 and 10 and an output contact 11. The distance across the area occupied by the semicircular branches is less than the electron mean free path in the semiconductor material. A control or gate electrode 12 with a cross dimension L is positioned in relationship across one branch 9 to permit, by application of a voltage signal relative to the contact 8 on the electrode 11, the application of an electric field perpendicular to the heterojunction 3.

The structure of FIG. 1, where a signal is provided at input 8, will exhibit constructive or destructive interference of the current at output 11 when an electric field is applied by a voltage signal on control electrode 12 and a drain voltage is applied between input 8 and output 11.

Figure 2:
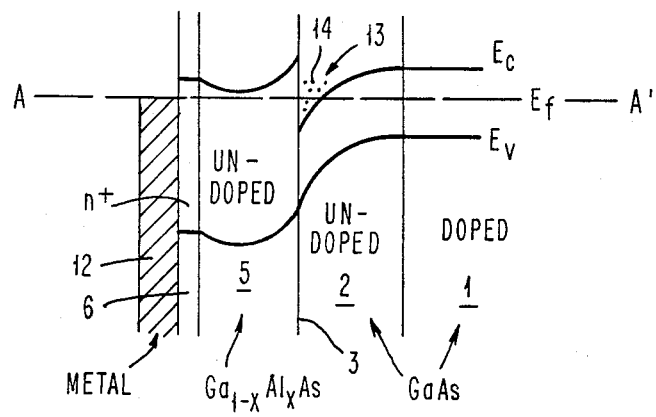
FIG. 2 is an energy diagram correlated with the structure illustrating the principles of the invention.

In FIG. 2 there is shown an energy diagram of the structure employing the principles of the invention taken along the line A-A' of FIG. 1. In the illustration of FIG. 2 the energy bands of the structure are shown for the regions identified by their reference numerals in FIG. 1. The metal electrode is the gate 12. The $Ga_{1-x}Al_xAs$ region 4 has a modulation doped n+ high conductivity layer 6 and an undoped layer 5 adjacent the heterojunction 3. The undoped GaAs layer 2 at the heterojunction 3 is in turn separated from a substrate not shown by a buffer layer 1 of doped GaAs.

The energy band structure at the heterojunction 3 between semiconductor materials with different band gaps, that is between the undoped $Ga_{1-x}Al_xAs$ layer 5 and the undoped GaAs layer 2 is such that the conduction band discontinuity produces a potential well 13 in which there is an electron gas 14.

In accordance with the invention, the magnitude of the electron gas and the performance of the wave behavior of the gas can be controlled through the application of an electric field by applying a voltage signal to the control or gate electrode 12 which operates to change the Fermi energy level with respect to the potential well.

In fabrication, the conducting path 7 may be shaped by etching a mesa through the $Ga_{1-x}Al_xAs$ region 4 so that it stands above the GaAs region 2 as is shown in FIG. 1. The conducting path 7 also may be alternately delineated by ion implanting boron through the $Ga_{1-x}Al_xAs$ and into the GaAs region so as to amorphize all GaAs outside of the loop structure.

Figure 3:
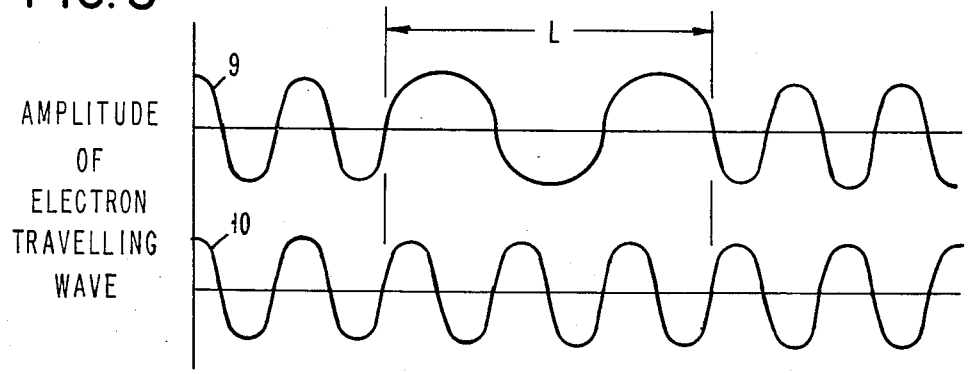
FIG. 3 is a schematic illustration of the traveling electron wave in the structure of FIGS. 1 and 2.

The effect of the electric field applied by a voltage signal on control electrode 12 is illustrated in FIG. 3 for the condition when a signal is applied to the input portion 8 of conducting path 7 and the current due to the interfering electron waves is sensed at the output portion 11.

In accordance with the invention in a structure built along the principles of FIGS. 1, 2 and 3, since it is possible to change the number of electrons in the potential well and hence the Fermi energy, a change in propagation vector and in wavelength of the traveling electron wave is caused to occur so that when this is accomplished locally in a branching conductor, there will be reinforcing or destructive interference with respect to an identical conductor not so affected.

Referring to FIG. 3, the electron wave traveling in from input 8 to output 11 around the semicircular path 10 remains the same at the output as at the input, whereas around the semicircular path 9 when an electric field is present as a result of a voltage signal applied on control electrode 12 the wave behavior locally is affected under the electrode along the dimension L which results in reinforcing or destructive interference between the current increments passing around the branches 9 and 10. In destructive interference, the current increments can cancel each other producing no signal at the output.

BEST MODE FOR CARRYING OUT THE INVENTION

In the structure of the invention, referring to FIG. 1, the region 2 would be undoped GaAs. The region 1 would be GaAs doped with Si to $10^{17}$ atoms per cm³. The layers 5 and 6 would be $Ga_{0.35}Al_{0.65}As$ doped in layer 6 with Si to $10^{17}$ atoms per cm³. Layer 5 would be undoped. The typical thickness for layer 5 would be 300 Å and for layer 6 would be 100 Å. The distance around each of the two equal length semicircular paths 9 and 10 would be less than 10 microns. The size L of the gating or control electrode 12 would be in the vicinity of 2000 Å.

Referring to FIG. 3, in order to produce interference, a phase shift should occur in the presence of the electric field and would be expressed as shown in Equation 1.

$$L \frac{1}{\lambda_1} - \frac{1}{\lambda_2} = n \text{ for constructive interference} \quad \text{Eq. 1}$$
$$\text{or}$$
$$n + \tfrac{1}{2} \text{ for destructive interference}$$

where

L is the length of the conductor under the gate of FIGS. 1 and 3

$\lambda_1$ is the wavelength at the Fermi surface in path 10 and in the regions of path 9 that are not under the gate 12.

$\lambda_2$ is the wavelength at the Fermi surface in path 9 under the gate 12.

n is an integer.

The Fermi energy of the electrons is given by $$E_F = \frac{\hbar^2 k_F^2}{2m} = \frac{\hbar^2 (2\pi)^2}{2m\lambda_F^2} \quad \text{Eq. 2}$$

where $k_F$ and $\lambda_F$ are the wave vectors and wavelengths at the Fermi surface, m is the electron effective mass, and $\hbar$ is Planck's constant divided by $2\pi$.

To examine a particular example, assume that the carrier concentration, $N_S$, in path 10 or in path 9 not under the gate 12, is $8 \times 10^{11}$ cm$^{-2}$, that L=2000 Å, then Equation 3 is employed to determine the $\lambda_1$ wavelength.

$$\lambda_F = 250 \frac{10^{12}}{N_S}^{\frac{1}{2}} \quad \text{Eq. 3}$$

which for an $N_S$ value of $8 \times 10^{11}$, $\lambda_1 = 280$ Å.

To produce destructive interference the wavelength $\lambda_2$ which is under the gate must be changed by converting using Eq. 1 to $$\lambda_2 = \frac{L}{\left( \frac{L}{\lambda_1} \pm \frac{1}{2} \right)} \quad \text{Eq. 4}$$

where the + corresponds to the two destructive interference conditions adjacent to the constructive peak. Under these conditions then $\lambda_2 = 262$ Å or 305 Å for the + or − sign, respectively.

The new values of $N_S$ under the gate can be calculated from Eq. 3 and would be $9.1 \times 10^{11}$ cm$^{-2}$ or $6.7 \times 10^{11}$ cm$^{-2}$, respectively. Thus an increase of $N_S$ of $1.1 \times 10^{11}$ cm$^{-2}$ or a decrease of $1.3 \times 10^{11}$ cm$^{-2}$ can cause the device to change from constructive to destructive interference. Assuming the thickness of the $Ga_{1-x}Al_xAs$ to be 400 Å, a voltage, $V_g$, of +0.064 or −0.075 V, respectively, would change the interference condition.

To calculate the gain of such a device, the degree to which perfect interference is achieved must be known. If the interference were perfect, the transmission, T, would be unity for constructive and zero for destructive interference. Any scattering would make both tend toward 0.5.

To continue the illustration, if T were to be =0.9 and 0.1 which is less than perfect interference, the resistance, R, of the device can be determined using the Landauer formula described in IBM Journal of Research and Development, July 1957, page 223.

$$R = \frac{\pi \hbar}{e^2} \frac{(1-T)}{T} \quad \text{Eq. 5}$$

For constructive or destructive interference R would respectively be $1.4 \times 10^3$ or $1.1 \times 10^5$ ohms. If a drain voltage, $V_D$, were applied between elements 10 and 7 in FIG. 1, then the current, $I_D$, would be $V_D/R$.

Where $V_D = 0.1$ V, and, $R = 1.4 \times 10^3$ or $R = 1.1 \times 10^5$ the current would be $7 \times 10^{-5}$ amps or $9 \times 10^{-7}$ amps for a change of gate voltage, $V_g$, of about 0.07 V. This represents a transconductance of about 1 millisieman.

Greater or less gain would be achieved by changing L, changing the $Ga_{1-x}Al_xAs$ thickness, changing T, or changing $V_D$.

The above analysis is only approximate and since Eq. 5 is designed around a one dimensional situation but the principles are clear.

The lower the temperature the easier to get a long mean free path.

Where the shift of phase is $2\pi$ radians n changes by 1 in Equation 1 the conductance goes through a maximum and a minimum and such a condition will provide the basis for a frequency multiplier.

In the light of the above principles of providing carriers in a potential well at a heterointerface under a multipath conductor and then changing the wave behavior of the carriers by movement of the Fermi level, it will be apparent to one skilled in the art that many substitutions and changes to the interferometer structure may be made. As examples it will be apparent that multiple gates in separate paths for frequency modulation and logic may be used. Further, by using different spatial positions of two or more ports or contacts such as 8 and 11 around the bifurcated paths or loop a device well known in the art as a circulator may be fabricated.

Having thus described my invention, what I claim as new and desire to secure by Letters Patent is:

1. A signal translating device comprising in combination
   a semiconductor crystal having a region of a first band gap semiconductor epitaxially joined and forming a heterojunction with a second semiconductor having a second smaller band gap,
   a conducting path essentially coplanar with said heterojunction having bifurcated signal paths, each said bifurcated path length being of the order of several mean free paths of an electron in said semiconductor, and
   means for impressing a localized electric field on said heterojunction under one of said bifurcated signal paths.

2. The device of claim 1 wherein said bifurcated paths are equal in length.

3. The device of claim 1 wherein said first region is $Ga_{1-x}Al_xAs$ and said second region is GaAs.

4. The device of claim 3 wherein said $Ga_{1-x}Al_xAs$ region is made up of a high conductivity surface region over an undoped region and both regions are in the shape of a conducting path with bifurcated segments.

5. In a signal interferometer type structure wherein interference occurs between bifurcated branches of a conducting path, the improvement comprising the providing of electron wave conduction in a potential well under said bifurcated branches and further providing electrical alteration of the Fermi level in the potential well under one of said bifurcated branches.

6. In an interferometer signal translator of the type where a signal is caused to pass along bifurcated segments of a conducting path, the improvement to impart responsiveness to a voltage signal comprising providing the conducting path of a semiconductor member having a coplanar heterojunction and providing a localized electric field across said heterojunction under a portion of one segment of said conducting path.

7. The signal translator of claim 6 where the semiconductor is $Ga_{1-x}Al_xAs$ and GaAs layers.

8. The signal translator of claim 7 where said GaAs is undoped and is separated from a substrate by a buffer layer of GaAs doped with Si to $10^{17}$ atoms/cm$^3$, and the $Ga_{1-x}Al_xAs$ is undoped adjacent said heterojunction and has a region at the surface of $Ga_{0.35}Al_{0.65}As$ doped with Si to $10^{17}$ atoms/cm$^3$.

9. The signal translator of claim 8 where the diameter of the bifurcated portion of said conductor is 3 microns and the L dimension of the gate producing said localized electric field is 2000 Å.

* * * * *